(12) United States Patent
Xu

(10) Patent No.: US 10,497,906 B2
(45) Date of Patent: Dec. 3, 2019

(54) MANUFACTURING METHOD OF THIN FILM TRANSISTOR ARRAY SUBSTRATE

(71) Applicant: Shenzhen China Star Optoelectronics Semiconductor Display Technology Co., Ltd., Guangdong (CN)

(72) Inventor: Hongyuan Xu, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 4 days.

(21) Appl. No.: 15/576,773

(22) PCT Filed: Nov. 16, 2017

(86) PCT No.: PCT/CN2017/111248
§ 371 (c)(1),
(2) Date: Nov. 24, 2017

(87) PCT Pub. No.: WO2019/033595
PCT Pub. Date: Feb. 21, 2019

(65) Prior Publication Data
US 2019/0058165 A1 Feb. 21, 2019

(30) Foreign Application Priority Data
Aug. 15, 2017 (CN) .......................... 2017 1 0696945

(51) Int. Cl.
*H01L 51/00* (2006.01)
*H01L 51/56* (2006.01)
(Continued)

(52) U.S. Cl.
CPC ............ *H01L 51/56* (2013.01); *G03F 7/0035* (2013.01); *G03F 7/094* (2013.01); *G03F 7/16* (2013.01); *G03F 7/20* (2013.01); *H01L 27/12* (2013.01); *H01L 51/0003* (2013.01); *H01L 51/0021* (2013.01); *H01L 51/5206* (2013.01); *H01L 27/3244* (2013.01); *H01L 51/0005* (2013.01); *H01L 51/0012* (2013.01); *H01L 51/5012* (2013.01); *H01L 2227/323* (2013.01); *H01L 2251/308* (2013.01)

(58) Field of Classification Search
CPC . H01L 51/56; H01L 51/0003; H01L 51/0021; H01L 51/5206; H01L 51/0005; H01L 51/0012
See application file for complete search history.

(56) References Cited

U.S. PATENT DOCUMENTS

2007/0082434 A1   4/2007   Bae et al.

FOREIGN PATENT DOCUMENTS

CN         1945813 A      4/2007

*Primary Examiner* — Seahvosh Nikmanesh
(74) *Attorney, Agent, or Firm* — Muncy, Geissler, Olds & Lowe, P.C.

(57) ABSTRACT

A manufacturing method of a thin film transistor array substrate is provided in the present disclosure. A third mask of the present disclosure is configured to perform a hydrophobic treatment on a surface of a photoresist to form a hydrophobic group. Presence of the hydrophobic group makes a solution type transparent metal and an OLED material not covered on the surface of the photoresist, thereby facilitating photoresist stripping, and promoting stripping efficiency and process efficiency. Existence of the photoresist makes the OLED material form a fixed pattern. One of the masks can be saved to lower product costs.

9 Claims, 5 Drawing Sheets

(51) Int. Cl.
*G03F 7/16* (2006.01)
*G03F 7/20* (2006.01)
*G03F 7/09* (2006.01)
*H01L 51/52* (2006.01)
*G03F 7/00* (2006.01)
*H01L 27/12* (2006.01)
*H01L 27/32* (2006.01)
*H01L 51/50* (2006.01)

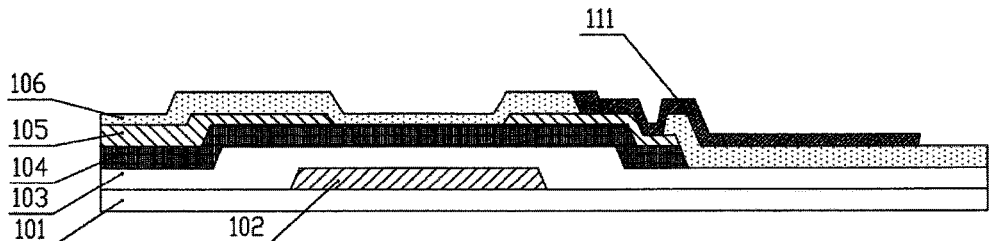

FIG. 2G

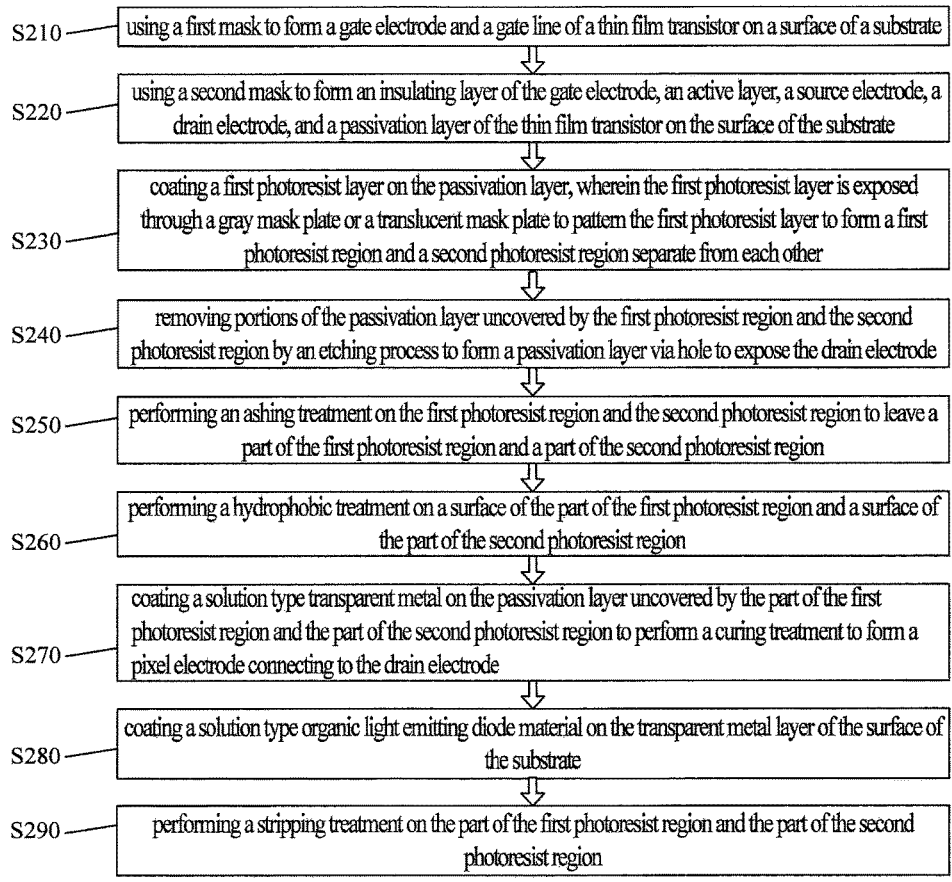

S210 — using a first mask to form a gate electrode and a gate line of a thin film transistor on a surface of a substrate S220 — using a second mask to form an insulating layer of the gate electrode, an active layer, a source electrode, a drain electrode, and a passivation layer of the thin film transistor on the surface of the substrate S230 — coating a first photoresist layer on the passivation layer, wherein the first photoresist layer is exposed through a gray mask plate or a translucent mask plate to pattern the first photoresist layer to form a first photoresist region and a second photoresist region separate from each other S240 — removing portions of the passivation layer uncovered by the first photoresist region and the second photoresist region by an etching process to form a passivation layer via hole to expose the drain electrode S250 — performing an ashing treatment on the first photoresist region and the second photoresist region to leave a part of the first photoresist region and a part of the second photoresist region S260 — performing a hydrophobic treatment on a surface of the part of the first photoresist region and a surface of the part of the second photoresist region S270 — coating a solution type transparent metal on the passivation layer uncovered by the part of the first photoresist region and the part of the second photoresist region to perform a curing treatment to form a pixel electrode connecting to the drain electrode S280 — coating a solution type organic light emitting diode material on the transparent metal layer of the surface of the substrate S290 — performing a stripping treatment on the part of the first photoresist region and the part of the second photoresist region

FIG. 3

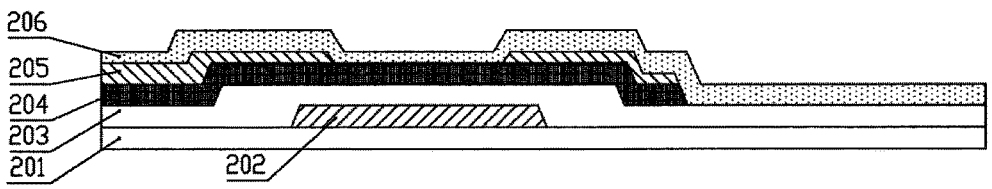

FIG. 4A

MANUFACTURING METHOD OF THIN FILM TRANSISTOR ARRAY SUBSTRATE

FIELD OF INVENTION

The present invention relates to a manufacturing method of a display panel, and more particularly to a manufacturing method of a thin film transistor array substrate.

BACKGROUND OF INVENTION

Liquid crystal displays (LCD) are widely used flat panel displays. The LCDs realizes screen display by switching liquid crystals to adjust backlight field intensity. Organic light emitting diode (OLED) devices have great application prospects in flat panel displays due to advantages of self-emitting, fully solid state, wide view angle, and quick response. The OLED devices are even considered to be a new generation product of flat panel displays following LCDs, and PDPs (plasma display panels).

The LCDs and the OLED display devices both comprise thin film transistor (TFT) devices. In this art, manufacturing process of the thin film transistor generally includes five masks. Production cost and duration will increase because too many masks are required, and production efficiency will greatly lowered. For reducing number of the masks, many companies have developed four-mask technology to form active layer (AS) and source/drain electrode (S/D) at the same time with one halftone mask (HTM) or one gray scale mask (GTM). The HTM or the GTM can form two different thicknesses of the photoresist, and the two thicknesses can define the pattern of the AS and the pattern of the S/D, respectively.

For further reducing the number of the masks, a lift-off process (stripping process) can be used for forming the ITO (transparent metal layer) and the PV (passivation layer) simultaneously with one mask, thereby the total number of masks can be reduced to 3 masks. However, the conventional 3-mask process is usually used for twisted nematic (TN) mode panels having the ITO without slits, or the ITO with slits. The ITO can only be deposited at the openings of the ITO with slits so that all ITO layers (including the pixel area) are in the recesses of the nitrogen silicon compound. The lateral electric field is lowered so as to affect display of the liquid crystal display and form uneven brightness. With development of technology, improved 3-mask technology is provides a PV/ITO layer formed by using a HTM or GTM mask, so that the pixel area of the ITO can form the slit, and cover the PV layer to form the structure the same as that produced by using 4 masks.

It is difficult for this 3-mask process to strip the photoresist which is covered by the ITO so that the stripping and efficiency are poor. In addition, residual photoresist after stripping and burr issues both can seriously affect process or product performance.

SUMMARY OF INVENTION

The present invention provides a manufacturing method of a thin film transistor array substrate, in order to solve problems that the photoresist is covered by a transparent metal layer and is difficult to be peeled off in the manufacturing method of the thin film transistor array substrate.

To achieve above objects, the present invention provides technical solutions as follows:

The present invention provides a manufacturing method of a thin film transistor array substrate, comprising:

a step (S110) of using a first mask to form a gate electrode and a gate line of a thin film transistor on a surface of a substrate;

a step (S120) of using a second mask to form an insulating layer of the gate electrode, an active layer, a source electrode, a drain electrode, and a passivation layer of the thin film transistor on the surface of the substrate;

a step (S130) of coating a first photoresist layer on the passivation layer, wherein the first photoresist layer is exposed through a gray mask plate or a translucent mask plate to pattern the first photoresist layer to form a first photoresist region and a second photoresist region separate from each other;

a step (S140) of removing portions of the passivation layer uncovered by the first photoresist region and the second photoresist region by an etching process to form a passivation layer via hole to expose the drain electrode;

a step (S150) of performing an ashing treatment on the first photoresist region and the second photoresist region to leave a part of the first photoresist region and a part of the second photoresist region;

the second photoresist region comprises a first photoresist sub-region and a second photoresist sub-region connected with each other, and a thickness of the first photoresist sub-region is less than a thickness of the second photoresist sub-region;

the step of performing the ashing treatment on the first photoresist region and the second photoresist region comprises: removing the first photoresist sub-region of the second photoresist region and reducing the thickness of the second photoresist sub-region to form the part of the second photoresist region; and reducing the thickness of the first photoresist region to form the part of the first photoresist region;

a step (S160) of performing a hydrophobic treatment on a surface of the part of the first photoresist region and a surface of the part of the second photoresist region;

a step (S170) of coating a solution type transparent metal on the passivation layer uncovered by the part of the first photoresist region and the part of the second photoresist region to perform a curing treatment to form a pixel electrode connecting to the drain electrode; and a step (S180) of performing a stripping treatment to the part of the first photoresist region and the part of the second photoresist region.

According to one preferred embodiment of the present invention, the step (S110) comprises:

a step (S111) of providing the substrate having a first metallic layer deposited on the surface of the substrate;

a step (S112) of coating a second photoresist layer on the first metallic layer;

a step (S113) of etching the first metallic layer to form the gate electrode and the gate line of the thin film transistor after the second photoresist layer is exposed and developed; and a step (S114) of stripping the second photoresist layer.

According to one preferred embodiment of the present invention, the step (S120) comprises:

a step (S121) of depositing the insulating layer of the gate electrode, the active layer, and a second metallic layer sequentially;

a step (S122) of coating a third photoresist layer on the second metallic layer;

a step (S123) of etching the second metallic layer to form the source electrode and the drain electrode after the third photoresist layer is exposed and developed;

a step (S124) of stripping the third photoresist layer; and a step (S125) of depositing the passivation layer on the insulating layer of the gate electrode.

According to one preferred embodiment of the present invention, the step (S150) comprises:

performing the ashing treatment by applying a second plasma to the first photoresist region and the second photoresist region, wherein the second plasma is oxygen.

According to one preferred embodiment of the present invention, the step (S160) comprises:

performing the hydrophobic treatment by applying a second plasma to the surface of the part of the first photoresist region and the surface of the part of the second photoresist region to form a hydrophobic group on the surface of the part of the first photoresist region and the surface of the part of the second photoresist region, and the hydrophobic group is hydrocarbyl with no affinity for water.

According to one preferred embodiment of the present invention, the first plasma is one or more of nitrogen tetrafluoride, sulfur hexafluoride, and oxygen.

According to one preferred embodiment of the present invention, before performing the stripping treatment to the part of the first photoresist region and the part of the second photoresist region, further comprises a step of:

coating a solution type organic light emitting diode (OLED) material on the transparent metal layer of the surface of the substrate.

According to one preferred embodiment of the present invention, the etching is dry etching.

According to one preferred embodiment of the present invention, the first mask and the second mask are halftone masks or gray scale masks.

The present invention further provides a manufacturing method of a thin film transistor array substrate, comprising:

a step (S310) of using a first mask to form a gate electrode and a gate line of a thin film transistor on a surface of a substrate;

a step (S320) of using a second mask to form an insulating layer of the gate electrode, an active layer, a source electrode, a drain electrode, and a passivation layer of the thin film transistor on the surface of the substrate;

a step (S330) of coating a first photoresist layer on the passivation layer, wherein the first photoresist layer is exposed through a gray mask plate or a translucent mask plate to pattern the first photoresist layer to form a first photoresist region and a second photoresist region separate from each other;

a step (S340) of removing portions of the passivation layer uncovered by the first photoresist region and the second photoresist region by an etching process to form a passivation layer via hole to expose the drain electrode;

a step (S350) of performing an ashing treatment on the first photoresist region and the second photoresist region to leave a part of the first photoresist region and a part of the second photoresist region;

a step (S360) of performing a hydrophobic treatmenton a surface of the part of the first photoresist region and a surface of the part of the second photoresist region;

a step (S370) of coating a solution type transparent metal on the passivation layer uncovered by the part of the first photoresist region and the part of the second photoresist region to perform a curing treatment to form a pixel electrode connecting to the drain electrode; and a step (S380) of performing a stripping treatment to the part of the first photoresist region and the part of the second photoresist region.

According to one preferred embodiment of the present invention, the step (S310) comprises:

a step (S311) of providing the substrate having a first metallic layer deposited on the surface of the substrate;

a step (S312) of coating a second photoresist layer on the first metallic layer;

a step (S313) of etching the first metallic layer to form the gate electrode and the gate line of the thin film transistor after the second photoresist layer is exposed and developed; and a step (S314) of stripping the second photoresist layer.

According to one preferred embodiment of the present invention, the step (S320) comprises:

a step (S321) of depositing the insulating layer of the gate electrode, the active layer, and a second metallic layer sequentially;

a step (S322) of coating a third photoresist layer on the second metallic layer;

a step (S323) of etching the second metallic layer to form the source electrode and the drain electrode after the third photoresist layer is exposed and developed;

a step (S324) of stripping the third photoresist layer; and a step (S325) of depositing the passivation layer on the insulating layer of the gate electrode.

According to one preferred embodiment of the present invention, the step (S350) comprises:

performing the ashing treatment by applying a second plasma to the first photoresist region and the second photoresist region, wherein the second plasma is oxygen.

According to one preferred embodiment of the present invention, the step (S360) comprises:

performing the hydrophobic treatment by applying a second plasma to the surface of the part of the first photoresist region and the surface of the part of the second photoresist region to form a hydrophobic group on the surface of the part of the first photoresist region and the surface of the part of the second photoresist region, and the hydrophobic group is hydrocarbyl with no affinity for water.

According to one preferred embodiment of the present invention, the first plasma is one or more of nitrogen tetrafluoride, sulfur hexafluoride, and oxygen.

According to one preferred embodiment of the present invention, before performing the stripping treatment to the part of the first photoresist region and the part of the second photoresist region, further comprises a step of:

coating a solution type organic light emitting diode (OLED) material on the transparent metal layer of the surface of the substrate.

According to one preferred embodiment of the present invention, the etching is dry etching.

According to one preferred embodiment of the present invention, the first mask and the second mask are halftone masks or gray scale masks.

The beneficial effect of the present invention is that, compared to the current technology, the photoresist surface is subjected to a hydrophobic treatment in the third mask process, so that the transparent metal and the OLED material do not cover the photoresist surface, thereby facilitating photoresist stripping, and promoting the stripping efficiency and the process efficiency. The existence of the photoresist makes the OLED materials form a fixed pattern. One of the masks can be saved to lower the cost of production.

BRIEF DESCRIPTION OF DRAWINGS

In order to more clearly illustrate the technical solutions in the embodiment or in the present invention, the following drawings, which are intended to be used in the description of the embodiment or of the present invention, will be briefly described. It is understood that the drawings described below are merely some embodiments of the present invention, and it will be possible to those skilled in the art to obtain other drawings according to these drawings without creative efforts.

FIGS. 2A to 2G show a technical flow of a manufacturing method of a thin film transistor array substrate according to the first embodiment of the present invention.

FIG. 3 is a flowchart for showing a manufacturing method of a thin film transistor array substrate according to a second embodiment of the present invention.

FIGS. 4A to 4H show a technical flow of a manufacturing method of a thin film transistor array substrate according to the second embodiment of the present invention.

DETAILED DESCRIPTION OF PREFERRED EMBODIMENTS

Figure 1:
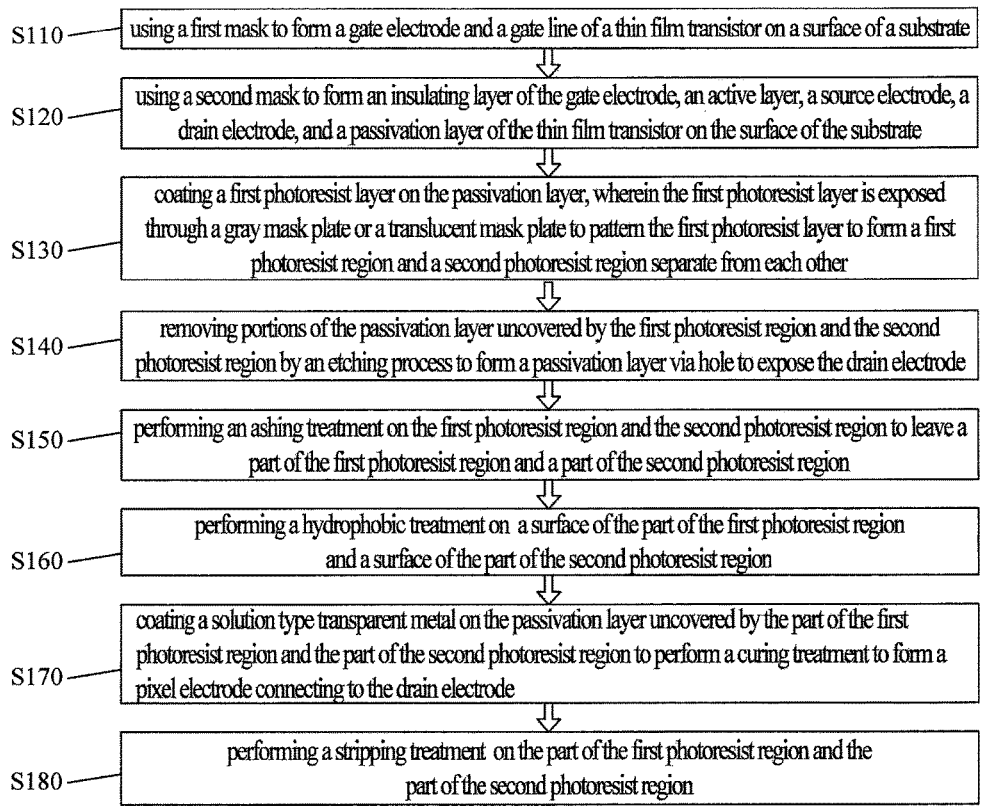
FIG. 1 is a flowchart of a manufacturing method of a thin film transistor array substrate according to a first embodiment of the present invention.

The description of the following embodiments is used for exemplifying the specific embodiments of the present invention by referring to the accompany drawings. Furthermore, directional terms described by the present invention, such as upper, lower, front, back, left, right, inner, outer, side, etc., are only directions by referring to the accompanying drawings, and thus the directional terms are used to describe and understand the present invention, but the present invention is not limited thereto. In the drawings, like reference numerals designate like elements throughout the specification.

The present invention provides a manufacturing method of a thin film transistor to improve defects of poor effects of stripping and poor efficiency because of difficulty in stripping photoresist covered by ITO in current 3-mask-technology.

FIG. 1 is a flowchart of a manufacturing method of a thin film transistor array substrate according to a first embodiment of the present invention. The method comprises steps of:

Step S110: using a first mask to form a gate electrode and a gate line of a thin film transistor on a surface of a substrate.

Figure 2A:
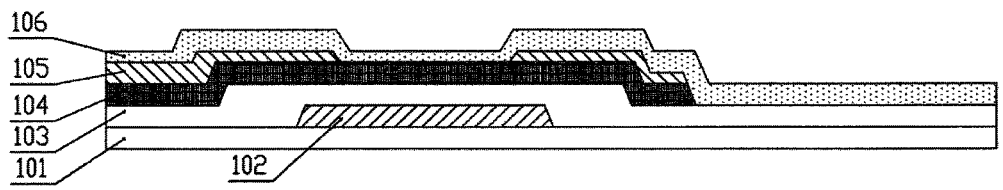

The specific step comprises: as shown in FIG. 2A, a first metallic thin layer is deposited on a glass substrate 101 by magnetron sputtering. The material of the metal can be molybdenum (Mo), aluminum (Al), aluminum-nickel alloy, molybdenum tungsten alloy, chromium (Cr), or copper (Cu). It is also possible to use a combination of the above-mentioned materials.

Next, a second photoresist layer is coated on the first metallic thin layer by a mask plate through exposing, developing, etching, and stripping process to form a gate electrode 102.

Step S120: using a second mask to form an insulating layer of the gate electrode, an active layer, a source electrode, a drain electrode, and a passivation layer of the thin film transistor on the surface of the substrate.

The specific step comprises: an insulating layer of the gate electrode 103 is deposited on a glass substrate 101 by a chemical method. In this embodiment, the material of the insulating layer of the gate electrode 103 is silicon nitride. It is also possible to use silicon oxide or silicon oxynitride.

Next, a metallic oxide thin layer is deposited on the insulating layer of the gate electrode 103 as an active layer by sputtering. Finally, a second metallic layer can be deposited on the active layer by magnetron sputtering.

A third photoresist layer is coated on the substrate having the insulating layer of the gate electrode 103, the active layer, and the second metallic layer thereon. The third photoresist layer is exposed and developed through a gray mask plate or a translucent mask plate, and then the second metallic layer is etched. Finally, stripping the photoresist to form source drain electrode 105 and an active layer pattern 104, wherein the second mask is a halftone mask or a gray scale mask.

Last, a passivation layer 106 is deposited on the glass substrate 101. Preferably, the material of the passivation layer is usually a silicon nitride compound.

Step 130: coating a first photoresist layer on the passivation layer, and the first photoresist layer is exposed through a gray mask plate or a translucent mask plate to pattern the photoresist to form a first photoresist region and a second photoresist region separated from each other.

Figure 2B:
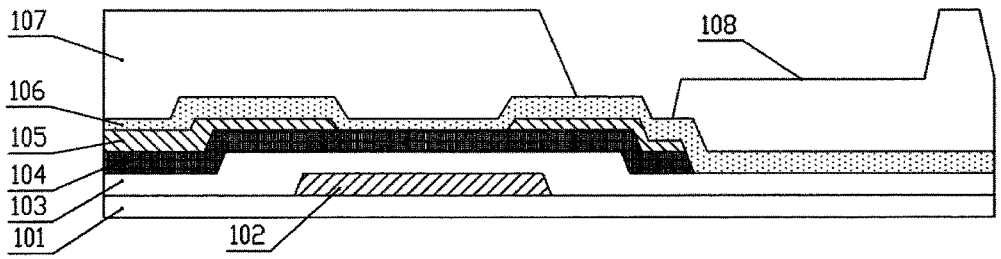

The specific step comprises: as shown in FIG. 2B, a first photoresist layer is coated on a surface of the passivation layer 106, and the photoresist is exposed through a gray mask plate or a translucent mask plate, and developed to form a fully reserved area, a semi-reserved area, and a completely removed area. In this embodiment, the completely removed area of the photoresist corresponds to the opening of the passivation layer. The fully reserved area of the photoresist corresponds to the first photoresist region 107, and the fully reserved area corresponds to the second photoresist region 108.

Step S140: removing portions of the passivation layer uncovered by the first photoresist region and the second photoresist region by an etching process to form a passivation layer via hole to expose the drain electrode.

Figure 2C:
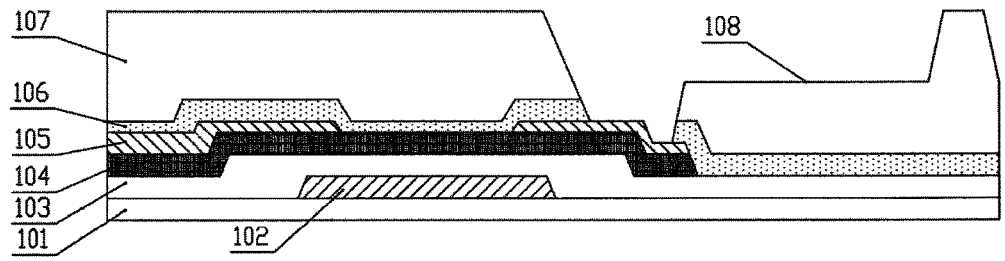

The specific step comprises: as shown in FIG. 2C, removing portions of the passivation layer 106 uncovered by the first photoresist region 107 and the second photoresist region 108 by an etching process to form a passivation layer via hole to expose the drain electrode. In this embodiment, the etching is dry etching.

Step S150, performing an ashing treatment on the first photoresist region and the second photoresist region to leave a part of the first photoresist region and a part of the second photoresist region.

Figure 2D:
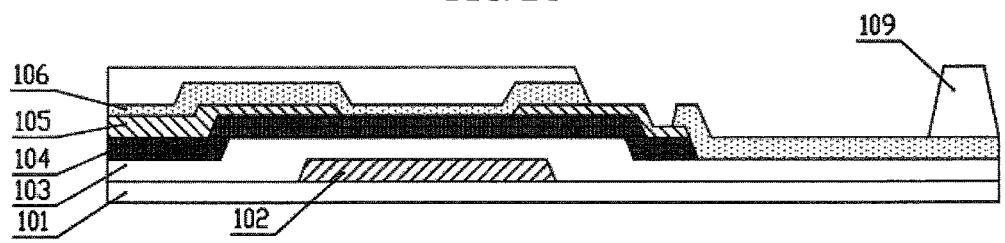

The specific step comprises: as shown in FIG. 2D, the second photoresist region comprises a first photoresist sub-region and a second photoresist sub-region connecting with each other, and a thickness of the first photoresist sub-region is less than a thickness of the second photoresist sub-region.

Performing the ashing treatment by applying a second plasma to the first photoresist region and the second photoresist region. Removing the first photoresist sub-region of the second photoresist region and reducing the thickness of the second photoresist sub-region to form the part of the second photoresist region; and reducing the thickness of the first photoresist region to form the part of the first photoresist region. In this embodiment, the second plasma used in the ashing treatment is preferably oxygen.

Step S160: performing a hydrophobic treatment on a surface of the part of the first photoresist region and a surface of the part of the second photoresist region.

Figure 2E:
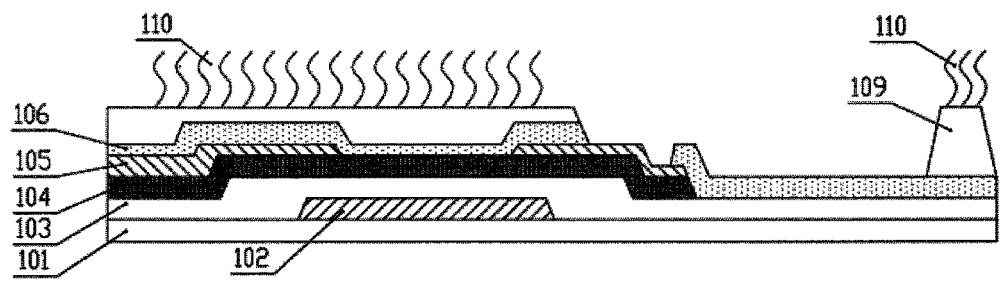

The specific step comprises: as shown in FIG. 2E, performing a hydrophobic treatment by applying a first plasma on a surface of the part of the first photoresist region and a surface of the part of the second photoresist region to form a hydrophobic group 110 on the surface of the part of the first photoresist region and the surface of the part of the second photoresist region, and the hydrophobic group 110 is hydrocarbyl with no affinity for water.

The first plasma of the hydrophobic treatment is one or more of nitrogen tetrafluoride, sulfur hexafluoride, and oxygen.

Step S170: coating a solution type transparent metal on the passivation layer uncovered by the part of the first photoresist region and the part of the second photoresist region, and perform a curing treatment on the solution type transparent metal to form a pixel electrode connecting to the drain electrode.

Figure 2F:
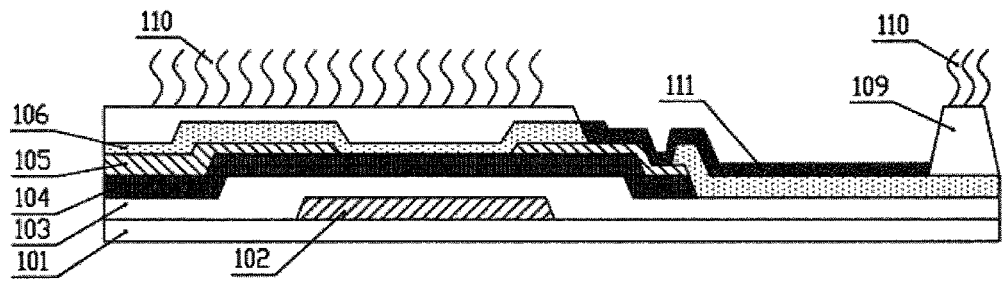

The specific step comprises: as shown in FIG. 2F, a solution type transparent metal is coated on a surface of the glass substrate 101. Since the hydrophobic group is applied on the part of the first photoresist region and the part of the second photoresist region 110, the solution type transparent metal would cover a position uncovered by the photoresist. Next, the solvent in the transparent metal solution is removed by baking, and the solution type transparent metal is cured to form the pixel electrode connecting to the drain electrode.

Step S180: performing a stripping treatment on the part of the first photoresist region and the part of the second photoresist region.

The specific step comprises: as shown in FIG. 2G, performing a stripping treatment on the part of the first photoresist region and the part of the second photoresist region on the glass substrate 101; removing the photoresist on the glass substrate 101 to form a pixel electrode pattern 111. In this embodiment, the stripping is carried out by using a photoresist stripping solution.

So far, the whole basic structure of the thin film transistor array substrate is completed. This manufacturing process of the thin film transistor array substrate can be slightly modified according to the actual situation.

FIG. 3 is a flow chart for showing a manufacturing method of a thin film transistor array substrate according to a second embodiment of the present invention. The method comprises steps of:

Step S210: using a first mask to form a gate electrode and a gate line of a thin film transistor on a surface of a substrate.

The specific step comprises: as shown in FIG. 4A, a first metallic thin layer is deposited on a glass substrate 201 by magnetron sputtering. The material of the metal can be molybdenum (Mo), aluminum (Al), aluminum-nickel alloy, molybdenum tungsten alloy, chromium (Cr), or copper (Cu). It is also possible to use a combination of the above-mentioned materials.

Next, a second photoresist layer is coated on the first metallic thin layer by a mask plate through exposing, developing, etching, and stripping process to form a gate electrode 202.

Step S220: using a second mask to form an insulating layer of the gate electrode, an active layer, a source electrode, a drain electrode, and a passivation layer of the thin film transistor on the surface of the substrate.

The specific step comprises: an insulating layer of the gate electrode 203 is deposited on a glass substrate 201 by a chemical method. In this embodiment, the material of the insulating layer of the gate electrode 103 is silicon nitride. It is also possible to use silicon oxide or silicon oxynitride.

Next, a metallic oxide thin layer is deposited on the insulating layer of the gate electrode 203 as an active layer by sputtering. Finally, a second metallic layer can be deposited on the active layer by magnetron sputtering.

A third photoresist layer is coated on the substrate having the insulating layer of the gate electrode 203, the active layer, and the second metallic layer thereon. The third photoresist layer is exposed and developed through a gray mask plate or a translucent mask plate, and then the second metallic layer is etched. Finally, the photoresist is stripped to form source drain electrode 205 and an active layer pattern 204, wherein the second mask is a halftone mask or a gray scale mask.

Last, a passivation layer 206 is deposited on the glass substrate 201. Preferably, the material of the passivation layer is usually a silicon nitride compound.

Step 230: coating a first photoresist layer on the passivation layer and the first photoresist layer is exposed through a gray mask plate or a translucent mask plate to pattern the photoresist to form a first photoresist region and a second photoresist region separated from each other.

Figure 4B:
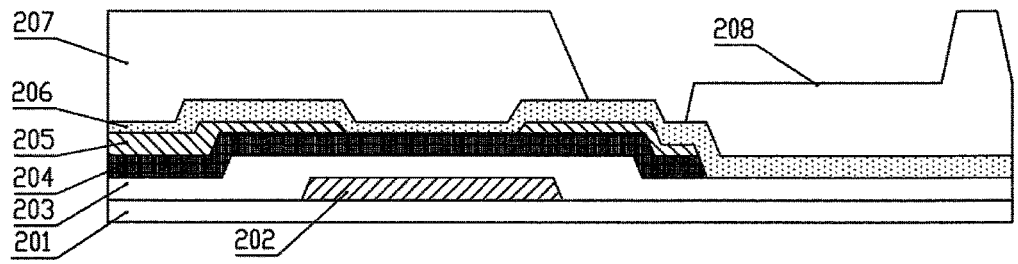

The specific step comprises: as shown in FIG. 4B, a first photoresist layer is coated on a surface of the passivation layer 206, and the photoresist is exposed through a gray mask plate or a translucent mask plate, and developed to form a fully reserved area, a semi-reserved area, and a completely removed area. In this embodiment, the completely removed area of the photoresist corresponds to the opening of the passivation layer. The fully reserved area of the photoresist corresponds to the first photoresist region 207, and the fully reserved area corresponds to the second photoresist region 208.

Step S240: removing portions of the passivation layer uncovered by the first photoresist region and the second photoresist region by an etching process to form a passivation layer via hole to expose the drain electrode.

Figure 4C:
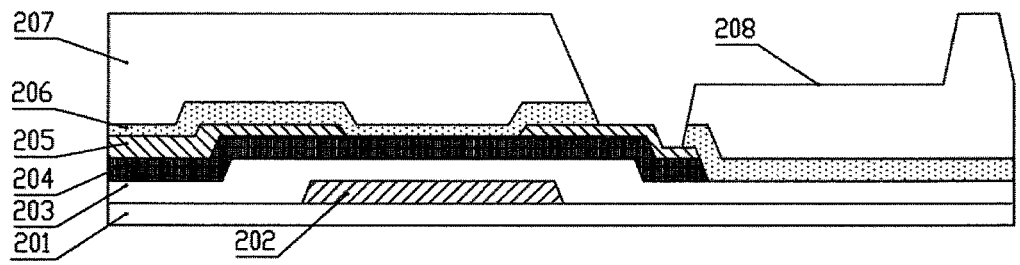

The specific step comprises: as shown in FIG. 4C, removing portions of the passivation layer 206 uncovered by the first photoresist region 207 and the second photoresist region 208 by an etching process to form a passivation layer via hole to expose the drain electrode. In this embodiment, the etching is dry etching.

Step S250, performing an ashing treatment on the first photoresist region and the second photoresist region to leave a part of the first photoresist region and a part of the second photoresist region.

Figure 4D:
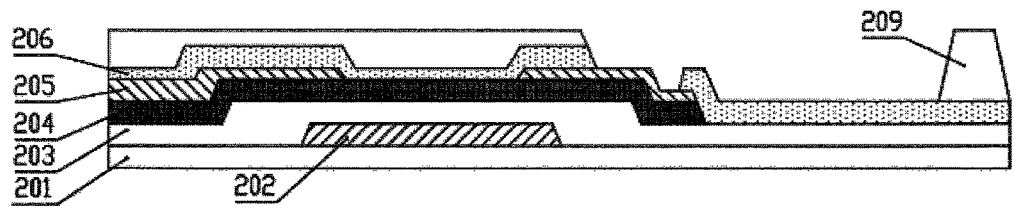

The specific step comprises: as shown in FIG. 4D, the second photoresist region comprises a first photoresist sub-region and a second photoresist sub-region connecting with each other, and a thickness of the first photoresist sub-region is less than a thickness of the second photoresist sub-region. Performing the ashing treatment by applying a second plasma on the first photoresist region and the second photoresist region. Removing the first photoresist sub-region of the second photoresist region and reducing the thickness of the second photoresist sub-region to form the part of the second photoresist region; and reducing the thickness of the first photoresist region to form the part of the first photoresist region. In this embodiment, the second plasma of the ashing treatment is preferably oxygen.

Step S260: performing a hydrophobic treatment on a surface of the part of the first photoresist region and a surface of the part of the second photoresist region.

Figure 4E:
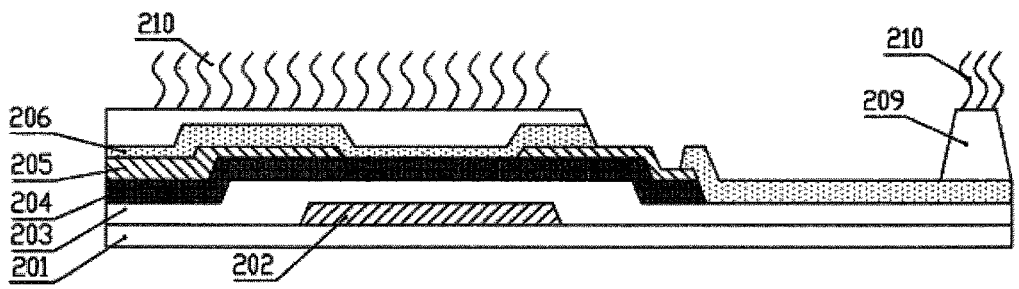

The specific step comprises: as shown in FIG. 4E, performing a hydrophobic treatment by applying a first plasma on a surface of the part of the first photoresist region and a surface of the part of the second photoresist region to form a hydrophobic group 210 on the surface of the part of the first photoresist region and the surface of the part of the second photoresist region, and the hydrophobic group 210 is hydrocarbyl with no affinity for water.

The first plasma of the hydrophobic treatment is one or more of nitrogen tetrafluoride, sulfur hexafluoride, and oxygen.

Step S270: coating a solution type transparent metal on the passivation layer uncovered by the part of the first photoresist region and the part of the second photoresist region, and perform a curing treatment on the solution type transparent metal to form a pixel electrode connecting to the drain electrode.

Figure 4F:
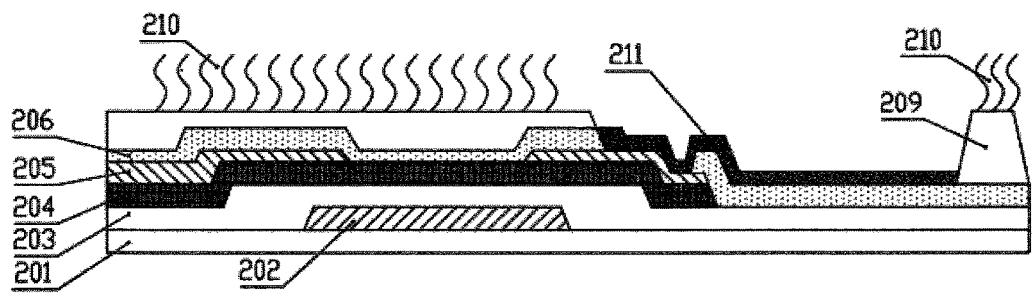

The specific step comprises: as shown in FIG. 4F, a solution type transparent metal is coated on a surface of the glass substrate 201. Since the hydrophobic group is applied on the part of the first photoresist region and the part of the second photoresist region 210, the solution type transparent metal would cover a position uncovered by the photoresist. Next, the solvent in the transparent metal solution is removed by baking, and the solution type transparent metal is cured to form the pixel electrode connecting to the drain electrode.

Step S280: coating a solution type organic light emitting diode (OLED) material on the transparent metal layer of the surface of the substrate.

The specific step comprises: coating the solution type OLED material by jet printing. Since the surface of the part of the first photoresist region and the surface of the part of the second photoresist region have the hydrophobic group, the solution type OLED material would not cover the surface of the photoresist. In addition, the photoresist makes the OLED material within the groove form a fixed OLED pattern 212. Finally, the solvent in the solution type OLED material is removed by baking.

Step S290: performing a stripping treatment on the part of the first photoresist region and the part of the second photoresist region.

Figure 4G:
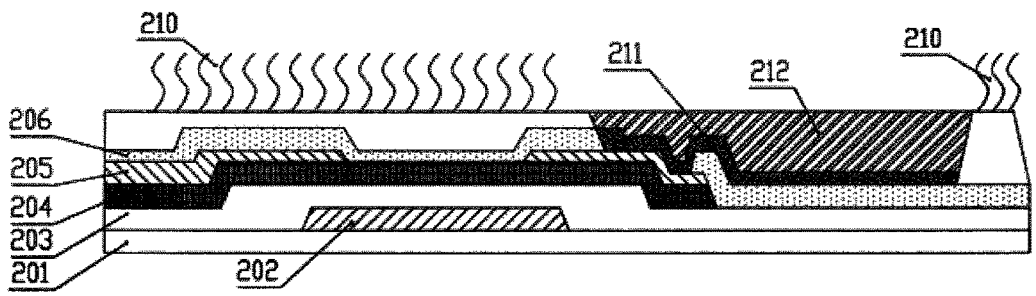
Figure 4H:
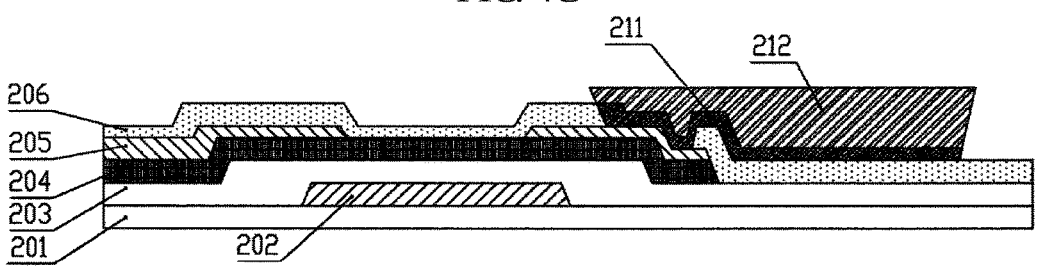

The specific step comprises: as shown in FIG. 4G, performing the stripping treatment on the part of the first photoresist region and the part of the second photoresist region on the glass substrate 201 to remove the photoresist on the surface of the glass substrate 201 to form a pixel electrode pattern 211. In this embodiment, the stripping is carried out by using a photoresist stripping solution.

The present invention provides a manufacturing method of a thin film transistor array substrate. Referring to the preferred embodiment of the present invention, the present invention belongs to typical three-mask-processes, in which one of the masks can be saved by completing the passivation layer and the pixel electrode with one mask. The main features are:

In the present invention, the photoresist surface is subjected to a hydrophobic treatment, so that the transparent metal and the OLED material do not cover the photoresist surface, thereby facilitating photoresist stripping, and promoting the stripping efficiency and the process efficiency. The existence of the photoresist makes the OLED materials form a fixed pattern. One of the masks can be saved to lower the cost of production.

The present invention has been described with preferred embodiments thereof and it is understood that many changes and modifications to the described embodiments can be carried out by the skilled person in the art without departing from the scope and the spirit of the invention that is intended to be limited only by the appended claims.

What is claimed is:

1. A manufacturing method of a thin film transistor array substrate, comprising:
    a step S110 of using a first mask to form a gate electrode and a gate line of a thin film transistor on a surface of a substrate;
    a step S120 of using a second mask to form an insulating layer of the gate electrode, an active layer, a source electrode, a drain electrode, and a passivation layer of the thin film transistor on the surface of the substrate;
    a step S130 of coating a first photoresist layer on the passivation layer, wherein the first photoresist layer is exposed through a gray mask plate or a translucent mask plate to pattern the first photoresist layer to form a first photoresist region and a second photoresist region separate from each other;
    a step S140 of removing portions of the passivation layer uncovered by the first photoresist region and the second photoresist region by an etching process to form a passivation layer via hole to expose the drain electrode;
    a step S150 of performing an ashing treatment on the first photoresist region and the second photoresist region to leave a part of the first photoresist region and a part of the second photoresist region;
        wherein the second photoresist region comprises a first photoresist sub-region and a second photoresist sub-region connected with each other, and a thickness of the first photoresist sub-region is less than a thickness of the second photoresist sub-region; and
        wherein the step S150 of performing the ashing treatment on the first photoresist region and the second photoresist region comprises:
        removing the first photoresist sub-region of the second photoresist region and reducing the thickness of the second photoresist sub-region to form the part of the second photoresist region; and
        reducing the thickness of the first photoresist region to form the part of the first photoresist region;
    a step S160 of performing a hydrophobic treatment on a surface of the part of the first photoresist region and a surface of the part of the second photoresist region;
    a step S170 of coating a solution type transparent metal on the passivation layer uncovered by the part of the first photoresist region and the part of the second photoresist region to perform a curing treatment to form a pixel electrode connecting to the drain electrode; and
    a step S180 of performing a stripping treatment on the part of the first photoresist region and the part of the second photoresist region.

2. The manufacturing method according to claim 1, wherein the step (S110 comprises:
    a step S111 of providing the substrate having a first metallic layer deposited on the surface of the substrate;
    a step S112 of coating a second photoresist layer on the first metallic layer;
    a step S113 of etching the first metallic layer to form the gate electrode and the gate line of the thin film transistor after the second photoresist layer is exposed and developed; and
    a step S114 of stripping the second photoresist layer.

3. The manufacturing method according to claim 1, wherein the step S120 comprises:
    a step S121 of depositing the insulating layer of the gate electrode, the active layer, and a second metallic layer sequentially;
    a step S122 of coating a third photoresist layer on the second metallic layer;
    a step S123 of etching the second metallic layer to form the source electrode and the drain electrode after the third photoresist layer is exposed and developed;
    a step S124 of stripping the third photoresist layer; and
    a step S125 of depositing the passivation layer on the insulating layer of the gate electrode.

4. The manufacturing method according to claim 1, wherein the step S150 comprises:

performing the ashing treatment by applying a second plasma on the first photoresist region and the second photoresist region, wherein the second plasma is oxygen.

5. The manufacturing method according to claim 1, wherein the step S160 comprises:
performing the hydrophobic treatment by applying a second plasma on the surface of the part of the first photoresist region and the surface of the part of the second photoresist region to form a hydrophobic group on the surface of the part of the first photoresist region and the surface of the part of the second photoresist region, and the hydrophobic group is hydrocarbyl with no affinity for water.

6. The manufacturing method according to claim 5, wherein the first plasma is one or more of nitrogen tetrafluoride, sulfur hexafluoride, and oxygen.

7. The manufacturing method according to claim 1, wherein, before performing the stripping treatment on the part of the first photoresist region and the part of the second photoresist region, further comprises a step of:
coating a solution type organic light emitting diode (OLED) material on the transparent metal layer of the surface of the substrate.

8. The manufacturing method according to claim 2, wherein the etching is dry etching.

9. The manufacturing method according to claim 1, wherein the first mask and the second mask are halftone masks or gray scale masks.

* * * * *